US 11,636,988 B2

(12) United States Patent
Watanabe

(10) Patent No.: US 11,636,988 B2
(45) Date of Patent: Apr. 25, 2023

(54) ELECTRONIC CONTROL DEVICE, WORK VEHICLE, AND INPUT CIRCUIT

(71) Applicant: KUBOTA CORPORATION, Osaka (JP)

(72) Inventor: Kazuki Watanabe, Sakai (JP)

(73) Assignee: KUBOTA CORPORATION, Osaka (JP)

( * ) Notice: Subject to any disclaimer, the term of this patent is extended or adjusted under 35 U.S.C. 154(b) by 0 days.

(21) Appl. No.: 17/559,629

(22) Filed: Dec. 22, 2021

(65) Prior Publication Data

US 2022/0208481 A1 Jun. 30, 2022

(30) Foreign Application Priority Data

Dec. 24, 2020 (JP) .............................. JP2020-214880

(51) Int. Cl.
*H01H 1/60* (2006.01)
*H01H 9/16* (2006.01)
*H03K 17/18* (2006.01)
*H01H 1/00* (2006.01)

(52) U.S. Cl.
CPC .......... *H01H 1/605* (2013.01); *H01H 1/0015* (2013.01); *H01H 9/16* (2013.01)

(58) Field of Classification Search
USPC ....................................................... 307/137
See application file for complete search history.

(56) References Cited

U.S. PATENT DOCUMENTS

| 4,788,459 | A | * | 11/1988 | Tsugaru | ......... | H03K 19/017518 |
| | | | | | | 326/66 |
| 7,696,637 | B2 | | 4/2010 | Shoemaker | | |
| 2005/0231876 | A1 | * | 10/2005 | Komatsu | ................ | H01H 1/605 |
| | | | | | | 361/103 |
| 2009/0315410 | A1 | * | 12/2009 | Tyrrell | ................. | H03K 5/1254 |
| | | | | | | 307/135 |
| 2014/0139015 | A1 | * | 5/2014 | Poisson | .................... | H01H 1/60 |
| | | | | | | 307/112 |

(Continued)

FOREIGN PATENT DOCUMENTS

| EP | 2 139 114 A1 | | 12/2009 |
| JP | H02278620 | * | 11/1990 |
| JP | 07-14463 A | | 1/1995 |

(Continued)

*Primary Examiner* — Rexford N Barnie
*Assistant Examiner* — Xuan Ly
(74) *Attorney, Agent, or Firm* — Keating and Bennett, LLP

(57) ABSTRACT

An electronic control device includes an input terminal connected to a second terminal of a switch via an electrically conductive lead, an input circuit connected to the input terminal via a signal line, and a microcontroller to detect whether the switch is in an electrically conducting state or an electrically non-conducting state based on an output signal from the input circuit, and to perform at least one process in accordance with a detected result. The input circuit includes a first resistor connected to a supply voltage or ground and to the signal line, and a transient current circuit connected to the supply voltage or ground and to the signal line, the transient current circuit including a second resistor that allows a transient current to flow through the switch when the switch transitions from the electrically non-conducting state to the electrically conducting state.

16 Claims, 9 Drawing Sheets

(56) References Cited

U.S. PATENT DOCUMENTS

| | | | |
|---|---|---|---|
| 2016/0091908 A1* | 3/2016 | Edwards | G05F 1/56 323/274 |
| 2022/0140721 A1* | 5/2022 | Cannavo | H03K 17/133 307/10.1 |

FOREIGN PATENT DOCUMENTS

| | | |
|---|---|---|
| JP | 09-294341 A | 11/1997 |
| JP | 3587802 B2 | 11/2004 |

* cited by examiner

ELECTRONIC CONTROL DEVICE, WORK VEHICLE, AND INPUT CIRCUIT

CROSS-REFERENCE TO RELATED APPLICATION

This application claims priority to Japanese Patent Application No. 2020-214880, filed on Dec. 24, 2020, the entire contents of which are hereby incorporated by reference.

BACKGROUND OF THE INVENTION

1. Field of the Invention

The present disclosure relates to an electronic control device, a work vehicle, and an input circuit.

2. Description of the Related Art

A work vehicle such as an agricultural machine or a construction machine includes a cabin, within which elements such as a driver's seat and various control levers and operation switches are provided. For example, several dozen operation switches may be provided in the cabin. The open/closed state of an operation switch may be detected by a microcontroller that is included in an electronic control device which is mounted in the work vehicle, for example. The microcontroller performs desired processes in accordance with the detected result.

When a switch is used in the atmospheric air, the surface of contacts of the switch may undergo spontaneous oxidation and become corroded, causing an oxide film to occur on its surface. Since the oxide film behaves as a dielectric film, it may hinder electrical conduction at the contacts. The specification of U.S. Pat. No. 7,696,637, Japanese Patent No. 3587802, and Japanese Laid-Open Patent Publication No. 9-294341 each disclose an electric circuit for preventing corrosion by-products from occurring on switch contacts or removing such corrosion by-products.

SUMMARY OF THE INVENTION

Conventionally, in order to remove a corrosion by-product such as an oxide film occurring on switch contacts, it has been necessary to flow a current of, e.g., 10 mA or more, through the switch. This has led to a problem of increased power loss in the electric circuit.

Preferred embodiments of the present invention provide input circuits each of which can, with a relatively simple circuit configuration, remove corrosion by-products on a switch and reduce power losses, and also provide electronic control devices each including such an input circuit.

An electronic control device according to an illustrative preferred embodiment of the present disclosure is to be mounted in a work vehicle, the work vehicle including a switch that includes a first terminal and a second terminal to switch between an electrically conducting state and an electrically non-conducting state between the first terminal and the second terminal. The electronic control device includes an input terminal that is connected to the second terminal of the switch via an electrically conductive lead, an input circuit that is connected to the input terminal via a signal line, and a microcontroller to detect whether the switch is in the electrically conducting state or the electrically non-conducting state based on an output signal from the input circuit, and to perform at least one process in accordance with a detected result. The input circuit includes a first resistor connected to a supply voltage or ground and to the signal line, and a transient current circuit connected to the supply voltage or ground and to the signal line, the transient current circuit including a second resistor to allow a transient current to flow through the switch when the switch transitions from the electrically non-conducting state to the electrically conducting state.

A work vehicle according to an illustrative preferred embodiment of the present disclosure includes one or more switches manipulable by a user and the aforementioned electronic control device.

An input circuit according to an illustrative preferred embodiment of the present disclosure is to be connected via a signal line to an input terminal of an electronic control device to be mounted in a work vehicle, the work vehicle including a switch that includes a first terminal and a second terminal to switch between an electrically conducting state and an electrically non-conducting state between the first terminal and the second terminal. The input terminal is connected to the second terminal of the switch via an electrically conductive lead. The electronic control device includes a microcontroller to detect whether the switch is in the electrically conducting state or the electrically non-conducting state based on an output signal from the input circuit, and to perform at least one process in accordance with a detected result. The input circuit includes a first resistor connected to a supply voltage or ground and to the signal line, and a transient current circuit connected to the supply voltage or ground and to the signal line, the transient current circuit including a second resistor to allow a transient current to flow through the switch when the switch transitions from the electrically non-conducting state to the electrically conducting state.

According to certain preferred embodiments of the present disclosure, it is possible to remove corrosion by-products on a switch and reduce power losses, with a relatively simple circuit configuration.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
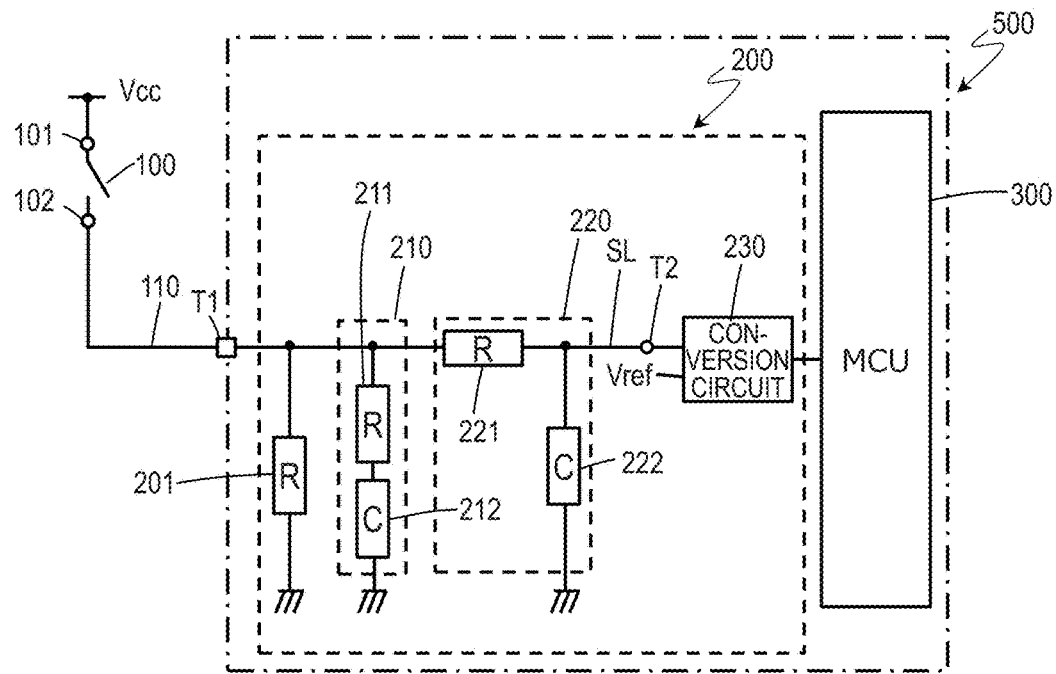
FIG. 1 is a block diagram showing an example configuration of an electronic control device including an input circuit according to a preferred embodiment of the present invention, in the case where a high-side switch is used as an operation switch.

Operation switches to be provided in the cabin of a work vehicle include switches to perform a variety of manipulations. Such operation switches may include a switch to perform clutch operations, a switch to select the gear shift as to a main gear shift or a range gear shift, a switch to switch between the auto mode and the manual mode, a switch to switch between forward travel and backward travel, and the like. As each such switch, a switch including contacts is generally used.

Examples of materials used for switch contacts include silver, silver-nickel, silver-tin oxide, silver-tungsten, and copper. In order to improve anti-corrosiveness and electrical conductivity, for example, the contact surface may be gold plated or gold cladded by cladding process. However, since an operation switch is not so well-sealed, if a switch is used in the atmospheric air, corrosion by-products including an oxide film, a sulfide film, etc., may adhere to the contact surface. Moreover, because of wear, corrosion by-products may adhere to the contact surface. In particular, since the user of a work vehicle will operate the work vehicle to perform a task under a harsh environment, it is easy for water to intrude into the operation switch, condensation to occur, and mud or the like to adhere. Thus, corrosion by-products are easy to adhere to the surface of the switch contacts. The corrosion by-products can be removed with an arc that occurs between the contacts by instantaneously flowing a current through the contacts. However, flowing a current through a switch leads to a problem in that some power is consumed in the circuit that is connected to the switch, thus increasing power loss.

An operation switch may be electrically connected to a microcontroller via an input circuit. This input circuit includes circuitry to remove corrosion by-products. The input circuit and the microcontroller may be implemented in an electronic control device. For example, in the case of a large-sized tractor over 100 horsepower, about 100 operation switches may be provided in the cabin. In this case, each operation switch is to be electrically connected via an input circuit to the microcontroller. When a current for removing corrosion by-products is allowed to flow through each operation switch, an increased power loss occurs in the input circuit. The more operation switches are connected via such input circuits, the more heat will be generated in the electronic control device that includes the input circuits. For this reason, an electronic control device needs to be accommodated in a metal housing that is made of an aluminum alloy material, for example, which excels in heat-releasing ability. Being accommodated in a metal housing provides an improved heat-releasing ability, and the electronic control device can be protected from any powder dust and water that may intrude under a harsh environment. However, adopting a metal housing may lead to a higher cost.

As mentioned above, the waterproofness of an operation switch is not so high, which makes it easier for water to intrude into the operation switch. Hereinafter, the entry of water into an operation switch will be referred to as "water intrusion". Note that "water intrusion" may also be expressed as "water leak". Water may contain inorganic substances and organic substances as impurities. Therefore, if water intrusion occurs, even an operation switch in an open state may electrically conduct. Due to water intrusion, a minute leakage current flowing through the operation switch may flow into the input circuit. As a result, even while the operation switch is open, a voltage rise may occur at the associated input terminal, such that the microcontroller may erroneously detect the switch as being in an electrically conducting state.

In the present specification, a state where a current flows through a switch will be referred to as an "electrically conducting state" or an "ON state". A state where no current flows through a switch will be referred to as an "electrically non-conducting state" or an "OFF state". A state where a minute leakage current is able to flow through a switch will be referred to as an "electrically non-conducting state".

In the input circuit configuration disclosed in the specification of U.S. Pat. No. 7,696,637, the switching ON/OFF of a power transistor, which is connected to a switch via a resistor and a diode that are in series connection, is controlled by a microcontroller. The microcontroller turns the power transistor ON for a short interval of 1 millisecond or less, only when detecting the ON/OFF state of the switch. This supposedly reduces power losses in the input circuit. However, depending on the required specifications or the like, a multiplexer or like devices may need to be connected between the input circuit and the microcontroller. Generally speaking, the microcontroller and the multiplexer will operate asynchronously. The input circuit disclosed in the specification of U.S. Pat. No. 7,696,637 requires ON/OFF control of the power transistor by using the microcontroller. Therefore, when a multiplexer is connected between the input circuit and the microcontroller, there is a problem in that synchronization cannot be achieved between the ON/OFF control of the power transistor and an output signal from the multiplexer.

In view of the above problem, the inventor of preferred embodiments of the present disclosure has discovered a novel input circuit configuration with a relatively simple circuit configuration that makes it possible to remove corrosion by-products on a switch that is connected to the input circuit and reduce power losses, thus arriving at example preferred embodiments of the present invention. According to example preferred embodiments of the present disclosure, it is possible to prevent a microcontroller from making an erroneous detection of the switch state, and allow a multiplexer or like devices to operate asynchronously with the microcontroller to be connected in between the input circuit and the microcontroller. Furthermore, by reducing power losses in the input circuit, it becomes possible to replace a metal housing with a resin sealing, which is lighter-weight than a metal housing and inexpensive.

Hereinafter, example preferred embodiments of the present disclosure will be described. Note however that unnecessarily detailed descriptions may be omitted. For example, detailed descriptions on what is well known in the art or redundant descriptions on what is substantially the same configuration may be omitted. This is to avoid lengthy description, and facilitate the understanding of those skilled in the art. The accompanying drawings and the following description, which are provided by the present inventor so that those skilled in the art can sufficiently understand the present disclosure, are not intended to limit the scope of claims. In the following description, component elements having identical or similar functions are denoted by identical reference numerals.

The following preferred embodiments are only exemplary, and an input circuit according to the present disclosure and an electronic control device including the input circuit are not limited to the following preferred embodiments. For example, numerical values, shapes, materials, steps, and orders of steps, etc., that are indicated in the following preferred embodiments are only exemplary, and admit of various modifications so long as it makes technological sense. Any one implementation may be combined with another so long as it makes technological sense to do so.

With reference to FIG. 1 to FIG. 9, an example configuration of an input circuit 200 and an electronic control device 500 according to the present preferred embodiment will be described. The electronic control device 500 may include, for example, an input I/F to be connected to a sensor(s), an output I/F to be connected to an actuator(s), and a CAN (Controller Area Network) bus I/F.

FIG. 1 is a block diagram showing an example configuration of the electronic control device 500 including the input circuit 200, in the case where a high-side switch(es) is used as an operation switch(es) 100.

The input circuit 200 according to the present preferred embodiment, and the electronic control device 500 including the input circuit 200, may be mounted in a work vehicle such as an agricultural machine or a construction machine, for example. Hereinafter, the electronic control device 500 will be illustrated as a device to be mounted in a tractor, which is a typical example of an agricultural machine.

"Electronic control device" is a general term for any device that controls the travel of a tractor by using an electronic circuit such as a processor, for example. An electronic control device may perform not only processes for controlling apparatuses that are used for engine control, transmission control, power steering control, and braking control, which are necessary for the travel of a work vehicle such as a tractor, but also processes that are necessary for the operation of various apparatuses to be used for positioning utilizing a GNSS (Global Navigation Satellite System), driving assistance such as self-driving or automatic steering, implement control, etc. In order to efficiently perform these processes, a single work vehicle may include a plurality of electronic control devices that perform respectively different processes. Such electronic control devices may also be referred to as ECUs (Electronic Control Units). Hence, in the present specification, an electronic control device may be referred to as an "ECU".

The electronic control device 500 includes an input terminal T1, the input circuit 200, and a microcontroller 300. These component elements may be mounted on, e.g., a printed circuit board (PCB), so as to be packaged as an ECU. A packaged ECU may be marketed as a device to be mounted on a work vehicle.

The electronic control device 500 may be mounted in a work vehicle that includes one or more operation switches. In the present preferred embodiment, the electronic control device 500 will be described as being mounted in a tractor that includes a plurality of operation switches 100. The configuration of the tractor will be described later.

Each operation switch 100 (hereinafter simply referred to as a "switch") includes two contacts: a first terminal 101 and a second terminal 102. In the example shown in FIG. 1, the switch 100 is an A contact switch. The switch 100 is able to switch between an electrically conducting state and an electrically non-conducting state between the first terminal 101 and the second terminal 102. In other words, the switch 100 is able to switch between an ON state and an OFF state. While the switch 100 is not pressed, the contacts are apart, so that the switch 100 is in an electrically non-conducting state. When the switch 100 is pressed, the contacts come in contact, so that the switch 100 is in an electrically conducting state.

Each switch 100 may be any structure that includes contacts, e.g., a mechanical switch or a mechanical relay. The switch 100 may be a push-button switch. Examples of the switch 100 include a switch to perform clutch operations, a switch to select the gear shift as to a main gear shift or a range gear shift, a switch to switch between the auto mode and the manual mode, a switch to switch between forward travel and backward travel, and a switch to raise or lower an implement. However, these switches are mere examples. The switch 100 may be disposed at a position in the cabin of a tractor where the switch 100 is manipulable by the user. The cabin of a tractor will be described later with reference to FIG. 16.

In the example shown in FIG. 1, the first terminal 101 of the switch 100 is connected to a supply voltage Vcc, whereas the second terminal 102 is connected to the input terminal T1 of the electronic control device 500 via an electrically conductive lead 110. In other words, the switch 100 is a high-side switch. For example, the electrically conductive lead 110 may be implemented as part of a wire harness. The input terminal T1 is configured so as to fit the connector of the wire harness. In the present specification, the term "connect" refers mainly to electrical connection between elements or structures. The supply voltage Vcc may be embodied as a battery power supply whose output voltage is in the range from about 12 V to about 14 V, for example.

The input circuit 200 includes a resistor 201, a transient current circuit 210, a low-pass filter circuit 220, and a conversion circuit 230. The input circuit 200 is connected to the input terminal T1 via a signal line SL. As a result, electrical connection is established between the switch 100 and the input circuit 200.

The resistor 201 fixes the logic voltage level of the signal line SL. The resistor 201 may be connected to the supply voltage Vcc or ground and to the signal line SL. In the example shown in FIG. 1, the resistor 201 is a so-called pull-down resistor, and is connected to the ground and the signal line SL.

Similarly to the resistor 201, the transient current circuit 210 may be connected to the supply voltage Vcc or ground and to the signal line SL. In the example shown in FIG. 1, the transient current circuit 210 is connected to the ground and the signal line SL. The transient current circuit 210 includes an RC series circuit that includes a resistor 211 and a capacitor 212. The RC series circuit is a time constant circuit. One end of the resistor 211 is connected to the signal line SL; the other end of the resistor 211 is connected to one end of the capacitor 212; and the other end of the capacitor 212 is connected to the ground. When the switch 100 transitions from an electrically non-conducting state to an electrically conducting state in response to a user's manipulation, the transient current circuit 210 causes a transient current to flow through the switch 100.

In the present preferred embodiment, the resistance value of the resistor 201 is set to be larger than the resistance value of the resistor 211. The resistance values of the respective resistors may be set so that the ratio of the resistance value of the resistor 201 to the resistance value of the resistor 211 is, e.g., equal to or greater than about 3.0 but less than about 5.0. For example, the resistance value of the resistor 201 may be on the order of several kΩ, and the resistance value of the resistor 211 may be on the order of several hundred Ω. The capacitance of the capacitor 212 is determined so that the time constant of the RC series circuit is on the order of several ten μs, for example.

The low-pass filter circuit 220 is an RC low-pass filter circuit that includes a resistor 221 and a capacitor 222. One end of the capacitor 222 is connected to the ground, and the other end of the capacitor 222 is connected to the signal line SL. The resistor 221 is in series connection with the signal line SL. In the present preferred embodiment, the resistance value of the resistor 221 may be, e.g., about 10 kΩ, and the capacitance of the capacitor 222 may be, e.g., about 0.1 μF. However, the low-pass filter circuit 220 is not essential. Providing the low-pass filter circuit 220 makes it possible to remove high-frequency noise components from an analog voltage signal that is input to the conversion circuit 230 as described below, and extract DC and low-frequency signal components therefrom.

The conversion circuit 230 converts an analog signal into a digital signal, based on a reference voltage Vref. More specifically, the conversion circuit 230 is configured to, based on the reference voltage Vref, convert an analog voltage signal on an output end T2 of the signal line SL into a digital signal at a logical high level or low level, and output the digital signal as an output signal. The reference voltage Vref corresponds to a threshold value that defines the boundary between the logical high level and the logical low level. Hereinafter, the logical high level will be denoted as "Hi level", whereas the logical low level will be denoted as "Lo level". As the conversion circuit 230, various circuit configurations may be adopted.

Figure 2:
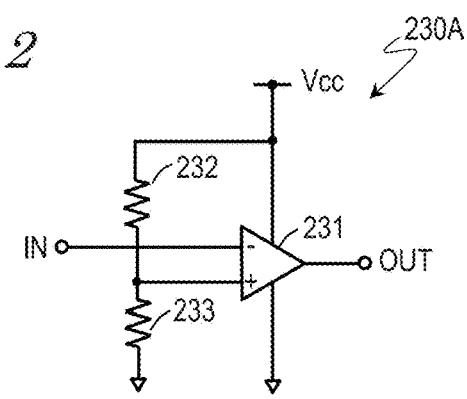
FIG. 2 is a circuit diagram showing an example configuration of a conversion circuit.

FIG. 2 is a circuit diagram showing an example configuration of the conversion circuit 230A. In the illustrated example, the conversion circuit 230A includes a comparator 231, and a voltage divider that includes two resistors 232 and 233 in series connection. The comparator 231 compares an input signal, which is an analog voltage signal, against the reference voltage Vref in terms of magnitude, and in accordance with the result of comparison, outputs a digital signal at the Hi level or the Lo level. To a non-inverting input terminal of the comparator 231, the voltage at a node between the two resistors 232 and 233 is input as the reference voltage Vref, whereas the analog voltage signal is input to an inverting input terminal thereof. A positive power terminal of the comparator 231 is connected to the supply voltage Vcc, whereas a negative power terminal thereof is connected to the ground.

In the present preferred embodiment, the resistor 232 may have a resistance value on the order of several kΩ, and the resistance value of the resistor 233 may be on the order of ten and a few kΩ, for example. The resistance value of the resistor 232 may be set so as to be about five times smaller than that of the resistor 233, for example. Using the comparator 231 allows the reference voltage Vref to be set to an appropriate value.

Figure 3:
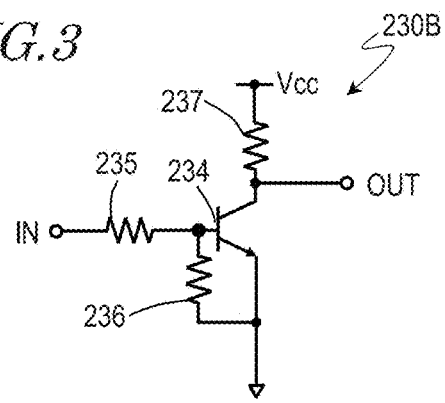
FIG. 3 is a circuit diagram showing another example configuration of the conversion circuit.

FIG. 3 is a circuit diagram showing an example configuration of a conversion circuit 230B. The comparator in the exemplary conversion circuit 230A may be replaced by any other device so long as it allows the threshold value to be fixed. For example, a bipolar transistor may be adopted as a device that allows the threshold value to be fixed. In the illustrated example, the conversion circuit 230B includes a bipolar transistor 234, and a voltage divider that includes two resistors 235 and 236 which are in series connection between the output end T2 of the signal line SL and the ground. An emitter of the bipolar transistor 234 is connected to the ground, and a base thereof is connected to a node between the two resistors 235 and 236. A collector of the bipolar transistor 234 is connected to the supply voltage Vcc via a resistor 237. Thus, the conversion circuit 230 may be configured so that its output signal will change in accordance with a collector voltage of the bipolar transistor 234.

In the present preferred embodiment, the resistance value of the resistor 235 may be, e.g., about 10 kΩ. The resistance value of the resistor 236 may be, e.g., about 2 kΩ. The resistance value of the resistor 237 may be, e.g., about 10 kΩ. However, these values are only examples, and the resistance values may be set as appropriate, depending on the required specifications and the like.

Figure 4:
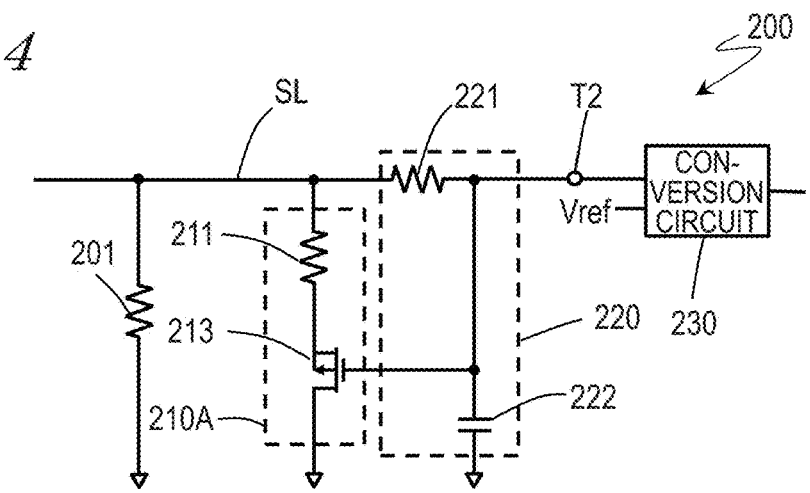
FIG. 4 is a circuit diagram showing another example configuration of a transient current circuit.

FIG. 4 is a circuit diagram showing another example configuration of the transient current circuit 210. In the illustrated example, the transient current circuit 210A includes a PMOS transistor 213 whose drain is connected to the ground. The resistor 211 is connected to the signal line SL and a source of the PMOS transistor 213. A gate of the PMOS transistor 213 is connected to the other end of the capacitor 222 being included in the low-pass filter circuit 220. The resistors 211 and 221, the PMOS transistor 213, and the capacitor 222 together define a time constant circuit and an RC filter circuit.

Figure 5:
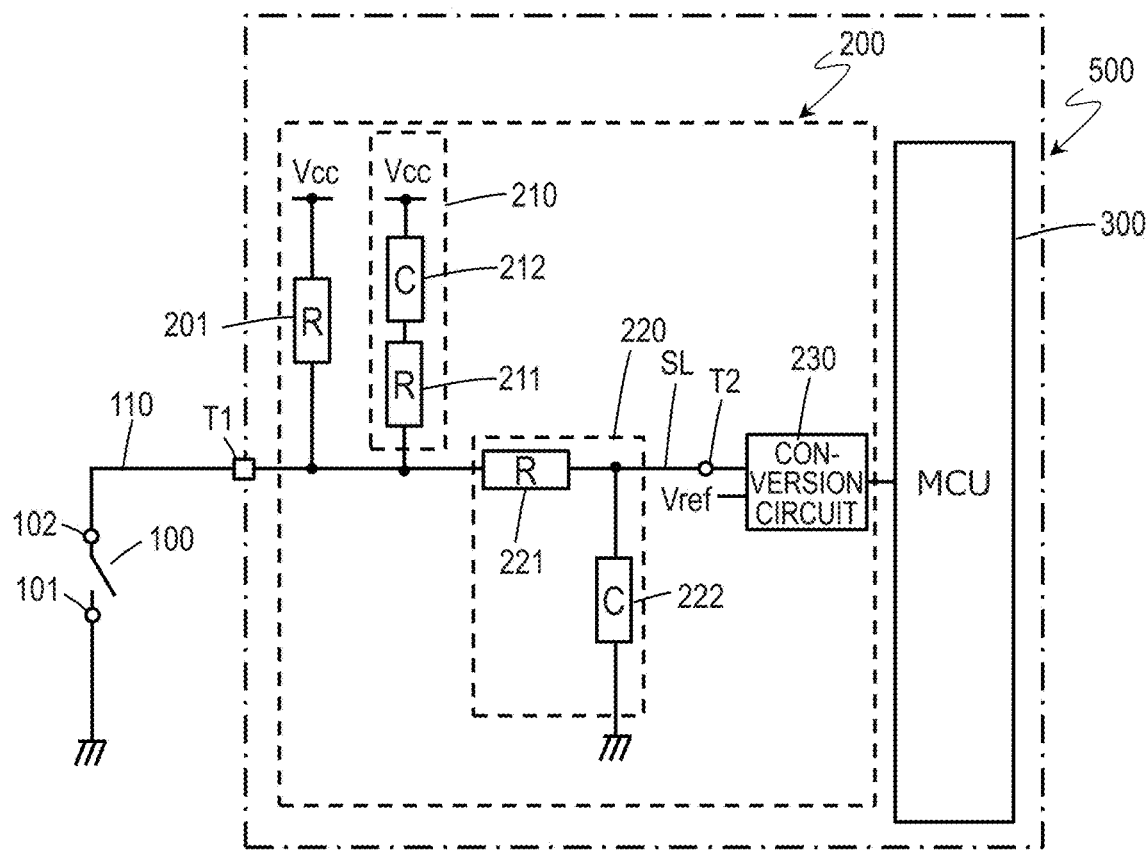
FIG. 5 is a block diagram showing an example configuration of an electronic control device including an input circuit according to a preferred embodiment of the present invention, in the case where a low-side switch is used as the operation switch.

FIG. 5 is a block diagram showing an example configuration of the electronic control device 500 including the input circuit 200, in the case where a low-side switch is used as the switch 100. In the illustrated example, a first terminal 101 of the switch 100 is connected to the ground, whereas a second terminal 102 is connected to the input terminal T1 of the electronic control device 500 via the electrically conductive lead 110. In other words, the switch 100 is a low-side switch. The resistor 201 is a so-called pull-up resistor, and is connected to the supply voltage Vcc and the signal line SL. Similarly to the resistor 201, the transient current circuit 210 is connected to the supply voltage Vcc or ground and to the signal line SL. The other electrical connection relationships are similar to those of the case where a high-side switch is used as the switch 100. Thus, the switch 100 may be a high-side switch or a low-side switch.

FIG. 1 is referred to again.

The microcontroller 300 is a semiconductor integrated circuit including a central processing unit (CPU), a cache, a ROM (Read Only Memory), a RAM (Random Access Memory), and peripheral circuitry. The microcontroller may be referred to as a microcomputer or a microprocessor unit (MPU). The microcontroller 300 is configured or programmed to, based on an output signal from the input circuit 200, detect whether the switch 100 is in an electrically conducting state or an electrically non-conducting state, and perform at least one process in accordance with the detected result. A computer program describing instructions for the CPU to perform at least one process is stored in the ROM. The ROM storing the computer program may be a memory that is external to the microcontroller 300. The CPU consecutively executes the instructions in the computer program to realize desired processes.

Figure 6:
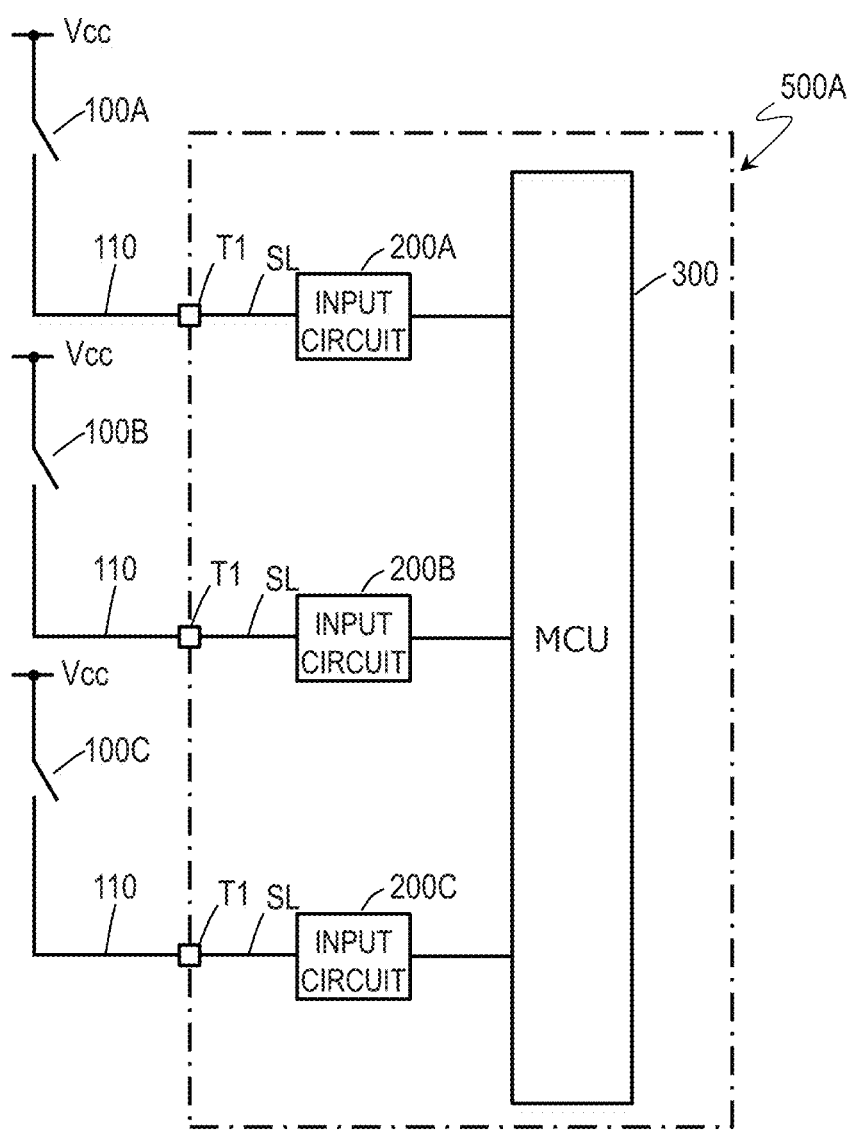
FIG. 6 is a block diagram showing an example configuration of an electronic control device having a plurality of input circuits according to a preferred embodiment of the present invention.

FIG. 6 is a block diagram showing an example configuration of an electronic control device 500A including a plurality of input circuits 200. The electronic control device 500A includes the plurality of input circuits 200 and a corresponding plurality of input terminals T1. In the example shown in FIG. 6, the electronic control device 500A includes three input circuits 200A, 200B and 200C and three input terminals T1. The three input terminals T1 are connected to three switches 100A, 100B ands 100C, respectively, via three electrically conductive leads 110. The three input circuits 200A, 200B and 200C are respectively connected to the three input terminals T1 via three signal lines SL. Thus, the switch 100A is connected to the microcontroller 300 via the input circuit 200A; the switch 100B is connected to the microcontroller 300 via the input circuit 200B, and the switch 100C is connected to the microcontroller 300 via the input circuit 200C.

Each of the plurality of input circuits 200 may have the same circuit configuration. However, depending on the type of the switch 100, the length of the electrically conductive lead 110 connecting the switch 100 and the input circuit 200, etc., the resistance values of the resistors and/or the capacitance values of the capacitors, etc., in the input circuit 200 may vary.

Without being limited to the illustrated example, given four or more switches 100, a corresponding number of input circuits 200 connected thereto may be connected to a single microcontroller 300. For example, 30 to 40 switches 100, or even more switches 100 may be provided in the tractor. In the case of a large-sized tractor, a three-digit number of switches 100, e.g., 100 or more, may be provided in the tractor. The input circuits 200 respectively connected to such a multitude of switches 100 may be connected to a single microcontroller 300.

Figure 7:
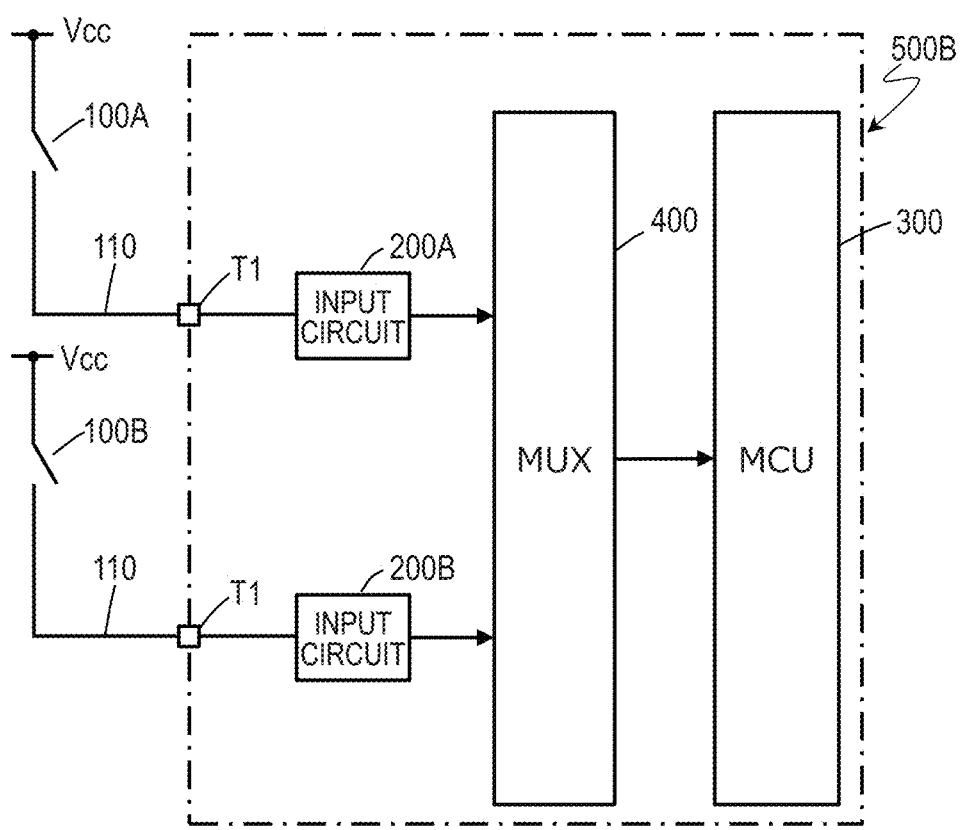
FIG. 7 is a block diagram showing an example configuration of an electronic control device including a multiplexer, according to a preferred embodiment of the present invention.

FIG. 7 is a block diagram showing an example configuration of an electronic control device 500B including a multiplexer 400. The electronic control device 500B may thus include the multiplexer 400. The multiplexer 400 is connected to a plurality of input circuits 200 and a microcontroller 300. The multiplexer 400 allows a selected one of output signals which are output from the plurality of input circuits 200 to be output to the microcontroller 300. Based on the output signal which is output from the multiplexer 400, the microcontroller 300 detects whether each switch 100 is in an electrically conducting state or an electrically non-conducting state.

In the illustrated example, output signals which are respectively output from the two input circuits 200A and 200B are input to the multiplexer 400. The two input circuits 200A and 200B may have the same circuit configuration. However, depending on the type of the switch 100, the length of the electrically conductive lead 110 connecting the switch 100 and the input circuit 200, etc., the resistance values of the resistors and/or the capacitance values of the capacitors, etc., may vary between the two input circuits 200A and 200B. Based on the output signal which is output from the multiplexer 400, the microcontroller 300 detects whether each of the two switches 100A and 100B is in an electrically conducting state or an electrically non-conducting state. Without being limited to the illustrated example, three or more input circuits 200 may be connected to the multiplexer 400. For example, in the case of an electronic control device to be mounted in a tractor, two or more input circuits 200, which are respectively connected to two or more switches for selecting the gear shift as to a main gear shift or a range gear shift, may be connected to a single multiplexer 400.

Figure 8:
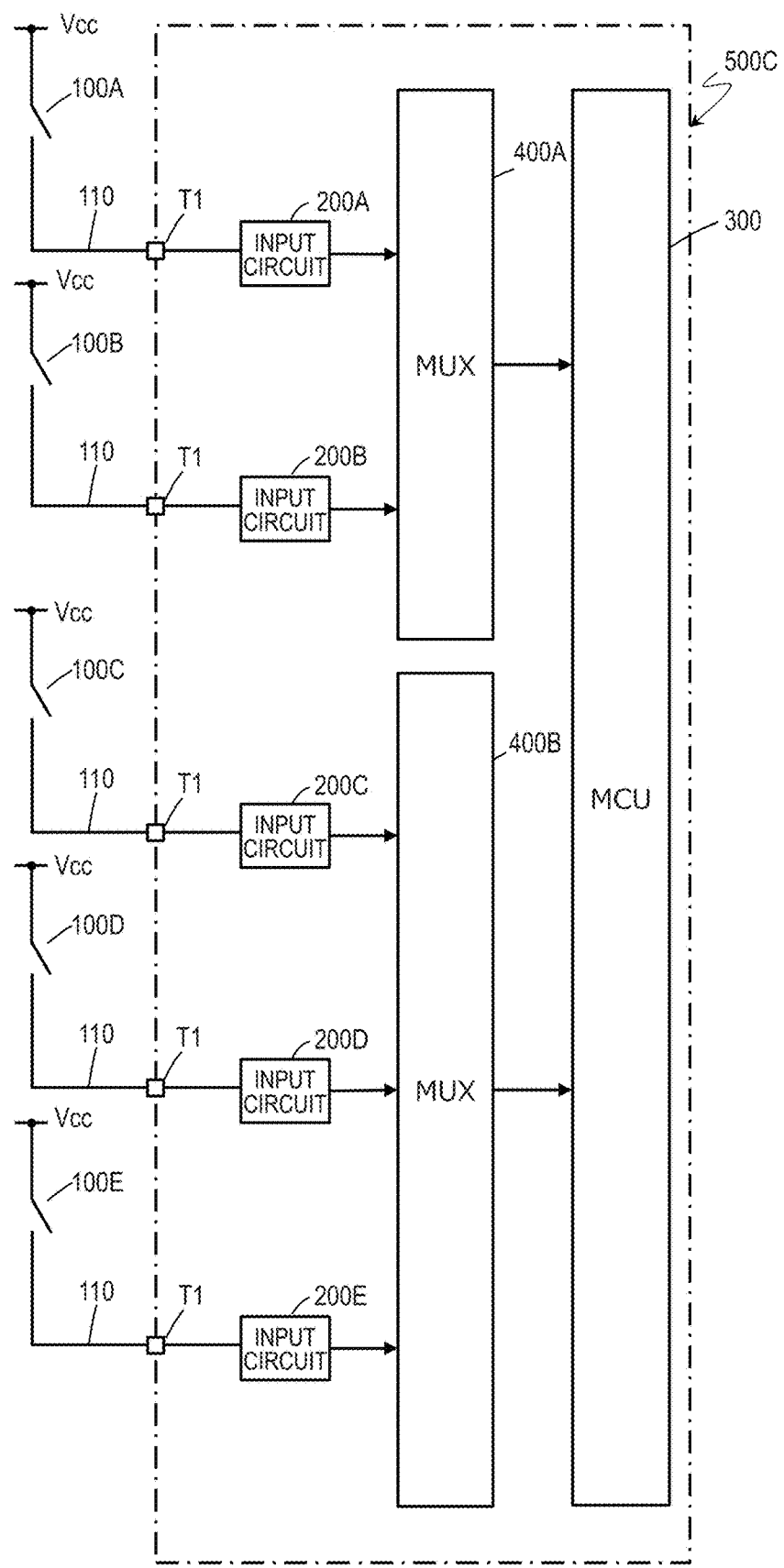
FIG. 8 is a block diagram showing an example configuration of an electronic control device including a plurality of multiplexers, according to a preferred embodiment of the present invention.

FIG. 8 is a block diagram showing an example configuration of an electronic control device 500C including a plurality of multiplexers 400. The electronic control device 500C may thus include the plurality of multiplexers 400. In the illustrated example, the plurality of multiplexers 400 includes a multiplexer 400A connected to two input circuits 200A and 200B, and a multiplexer 400B connected to three input circuits 200C, 200D and 200E. Without being limited to the illustrated example, depending on the required specifications and the like, for example, the electronic control device 500 may include three or more multiplexers 400.

Each of the plurality of input circuits 200 connected to the plurality of multiplexers 400 may have the same circuit configuration. However, depending on the type of the switch 100, the length of the electrically conductive lead 110 connecting the switch 100 and the input circuit 200, etc., the resistance values of the resistors and/or the capacitance values of the capacitors, etc., in the input circuit 200 may vary.

Figure 9:
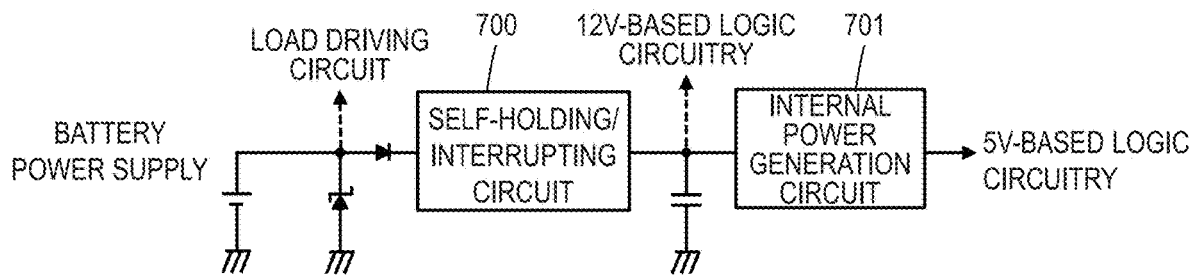
FIG. 9 is a block diagram showing an example of a power supply system in a tractor.

FIG. 9 is a block diagram showing an example of a power supply system in a tractor. In the illustrated example, a battery power supply is connected to a self-holding/interrupting circuit 700 via a protection element such as a Zener diode, a diode, or a fuse. The voltage of the battery power supply may be, e.g., about 12 V or about 14 V. The internal power generation circuit 701 is connected after the self-holding/interrupting circuit 700. The battery power supply may be connected to the first terminal 101 of the switch 100 and to a driving circuit to drive a load such as an engine, for example. The self-holding/interrupting circuit 700 includes a self-holding circuit, a current circuit breaker, and the like. The internal power generation circuit 701 may step down the voltage (e.g., about 12 V) of the battery power supply to generate a driving voltage to be supplied to 5 V-based logic circuitry, such as the microcontroller 300 and the multiplexer(s) 400, for example.

When starting the battery power supply, an inrush current to charge a bypass capacitor that is connected to the input side of an electronic component such as a microcontroller may flow. For example, an inrush current on the order of ten and a few A may flow. The self-holding/interrupting circuit 700 defines and functions as a current circuit breaker to protect the electronic component from the inrush current. The self-holding/interrupting circuit 700 isolates the block in which the inrush current may occur, from the logic circuitry block including 12 V-based and 5 V-based logic circuits, thus protecting the logic circuitry block from the inrush current.

The input circuit 200 according to the present preferred embodiment can be manufactured and sold as a component or structure to be mounted to an electronic control unit. The input circuit 200 may be made into a module, so that it can be marketed as an input circuit module, for example.

Figure 10:
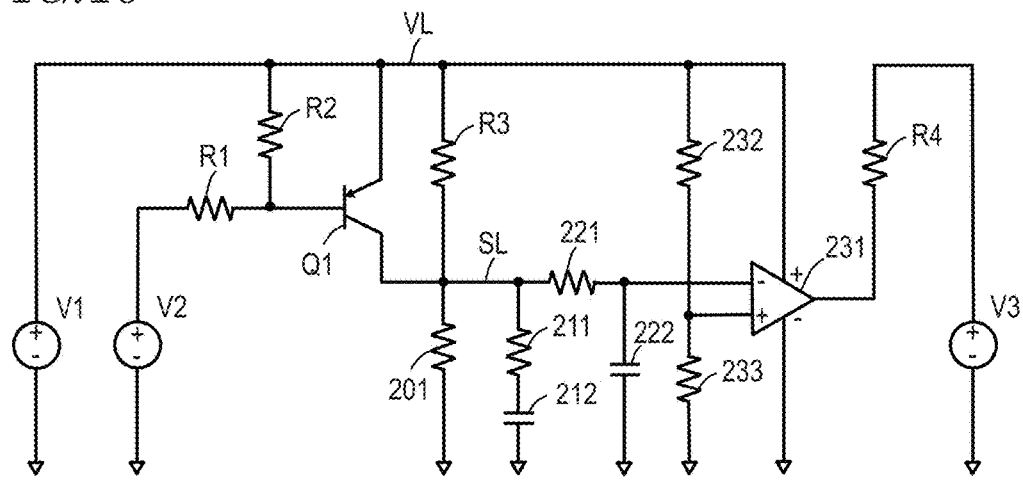
FIG. 10 is a circuit diagram illustrating an example circuit model envisaged for studying an output signal which is output from the conversion circuit when a leakage current occurs in response to water intrusion.
Figure 11:
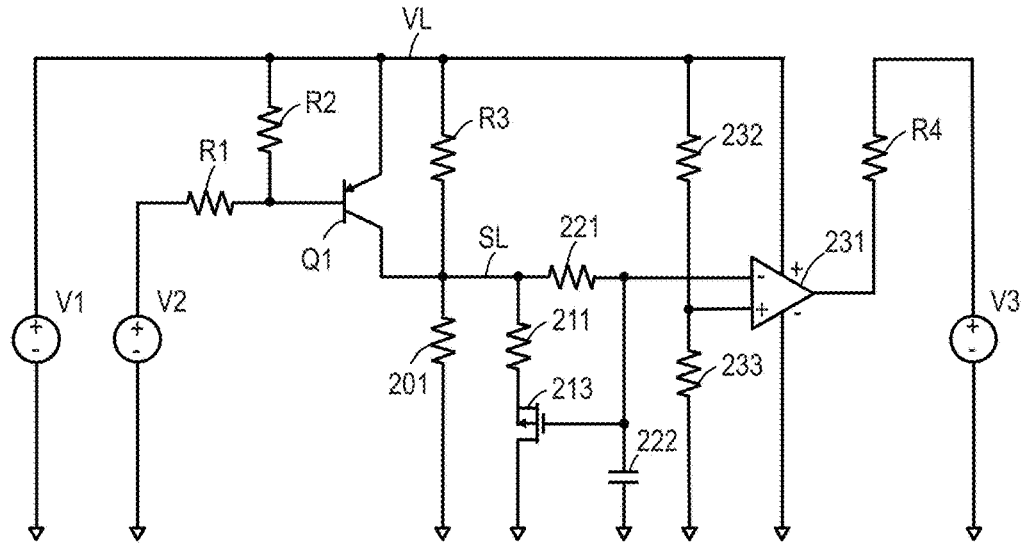
FIG. 11 is a circuit diagram illustrating another example circuit model envisaged for studying an output signal which is output from the conversion circuit when a leakage current occurs in response to water intrusion.
Figure 12:
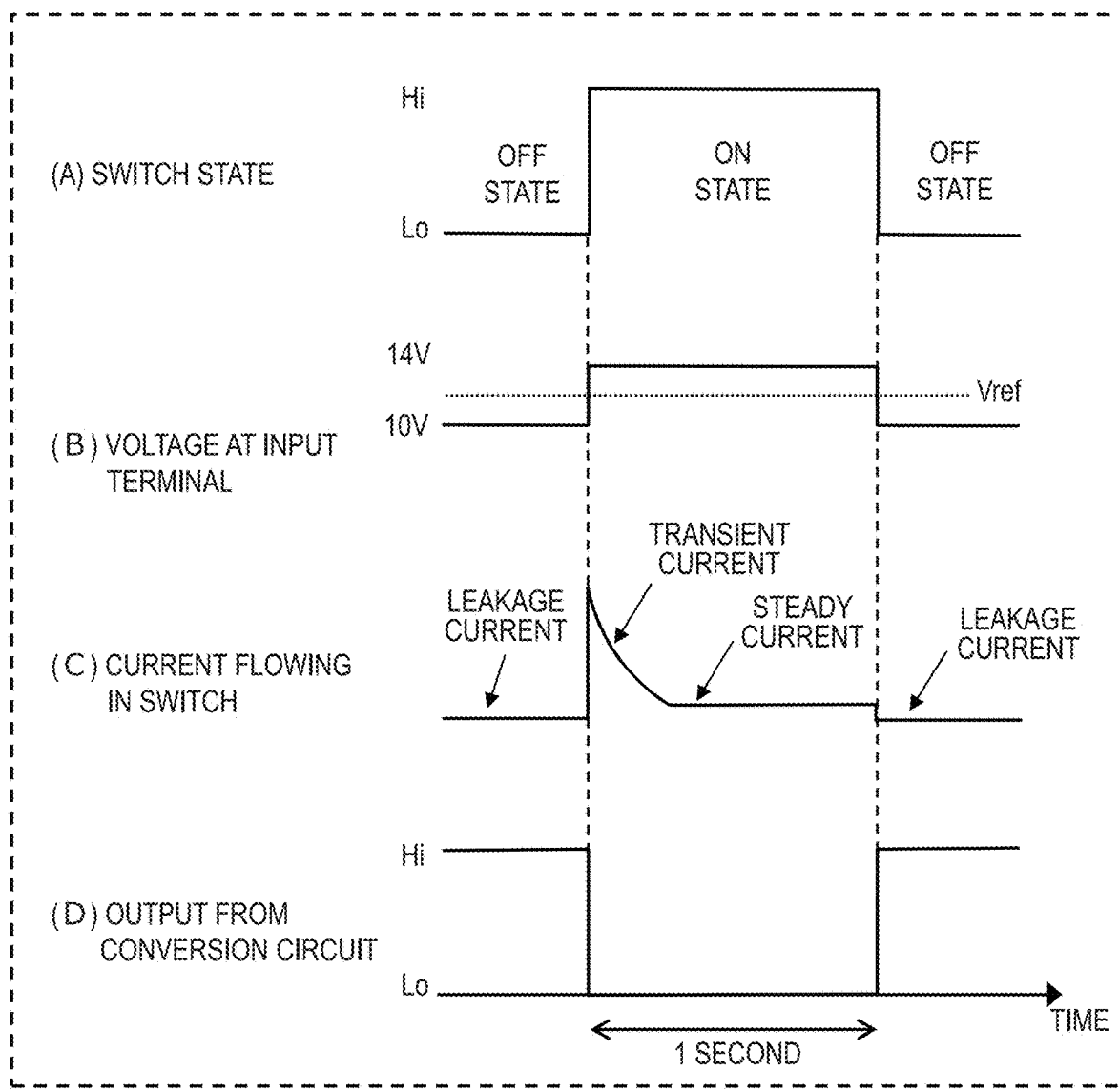
FIG. 12 is a graph illustrating examples of change in the voltage on the input terminal, change in a current flowing through a switch, and change in an output signal from the conversion circuit, in a period of 1 cycle.

With reference to FIG. 10 to FIG. 12, the function and operation of the input circuit 200 will be described.

FIG. 10 and FIG. 11 are circuit diagrams each illustrating an example circuit model envisaged for studying an output signal which is output from the conversion circuit 230 when a leakage current occurs in response to water intrusion. FIG. 10 shows a circuit model corresponding to the example configuration of the input circuit 200 illustrated in FIG. 1, whereas FIG. 11 shows a circuit model corresponding to the example configuration of the input circuit 200 illustrated in FIG. 4. FIG. 12 is a graph illustrating examples of change in the voltage on the input terminal T1, change in the current flowing through each switch 100, and change in the output signal from the conversion circuit 230, in a period of 1 cycle during which the switch 100 transitions from an OFF state to an ON state and then back to an OFF state. The change in the voltage on the input terminal T1 represents change in the voltage on the signal line SL. An example of the 1 cycle period may be 1 second.

In the illustrated circuit models, the switch 100 is modeled as a transistor Q1. A leakage current due to water intrusion is modeled as a resistor R3 that is connected to a power supply line VL and the signal line SL. Based on a ratio of the two resistors 201 and R3, the magnitude of the leakage current and the voltage occurring across both ends of the resistor 201 due to the leakage current become adjusted.

In the illustrated circuit models, the resistors 201, 211, 221, 232, 233, R1, R2, R3 and R4 respectively have resistance values of about 2.2 kΩ, about 470Ω, about 10 kΩ, about 2 kΩ, about 10 kΩ, about 10 kΩ, about 10 kΩ, about 500Ω, and about 10 kΩ, for example. The capacitors 212 and 222 each have a capacitance of about 0.1 μF, for example. The power supply V1 has a supply voltage of about 14 V, for example. The power supply V2 is a pulse generator to generate pulse voltage. The pulse voltage has a period, a pulse width, and an amplitude of about 2 s, about 1 s, and about 14 V, respectively, for example.

In the illustrated circuit models, irrespective of the ON/OFF state of the transistor Q1, a leakage current due to water intrusion steadily flows because of the resistor R3. Even when the transistor Q1 is in an OFF state, a leakage current of about 5 mA flows because of the resistor R3.

In an ideal state where no water intrusion exists, while the switch 100 is open, i.e., while the transistor Q1 is in an OFF state, the potential of the signal line SL will be 0 V. However, in actuality, since a leakage current due to water intrusion flows in the resistor 201, the potential of the signal line SL will increase due to a voltage drop corresponding to the voltage across both ends of the resistor 201. For example, when a leakage current of about 5 mA flows in the resistor 201, the potential of the signal line SL may increase by about 0 V to about 10 V, thereby reaching about 10 V, for example. Hereinafter, this voltage will be referred to as a "bias voltage". As a result, even though the switch 100 is open, the subsequent microcontroller 300 may erroneously detect the switch 100 as being in an electrically conducting state, because of the increased potential of the signal line SL. In the present preferred embodiment, this problem is solved by providing the conversion circuit 230 in the input circuit 200, as described below.

As mentioned above, the RC series circuit includes the resistor 211 and the capacitor 212, which are in series connection. When the transistor Q1 is turned ON, a transient current flows in the transistor Q1 because of the RC series circuit. The potential level of the input terminal T1, i.e., the potential of the signal line SL, changes to the supply voltage, i.e., about 14 V. For example, a transient current on the order of ten and a few mA may flow in a short period of time of about 0.1 ms. Since the transient current will flow into the transient current circuit 210, power losses in the input circuit can be reduced or prevented. The aforementioned inrush current is about two digits greater than the current order of the transient current, for example. The magnitude of the transient current is much smaller than the magnitude of the inrush current. Therefore, there is no need to provide a protection circuit for preventing any electric current destruction to be caused by the transient current in the input circuit. A transient current on the order of several ten mA is a sufficient amount of current to remove corrosion by-products on the switch. As a result of the transient current flowing through the switch, it is possible to remove corrosion by-products on the switch. Thus, corrosion by-products on the switch can be removed by utilizing a relatively simple circuit such as an RC series circuit.

After the transient current has transiently flowed through the switch 100, a steady current will flow. This steady current includes the leakage current. Because of the action of the RC series circuit, the steady current does not flow in the RC series circuit. On the other hand, the steady current can flow in the resistor 201, which is a pull-down resistor. In the present preferred embodiment, however, the resistance value of the resistor 201 may be about five times larger than the resistance value of the resistor 211 included in the RC series circuit. Therefore, current losses due to the steady current flowing in the resistor 201 can be reduced.

As shown in FIG. 11, instead of the capacitor 212, a PMOS transistor 213 may be used in order to provide similar effects to those obtained by using an RC series circuit. A transient current will flow at the moment the transistor Q1 is turned ON. As the capacitor 222 becomes charged by the transient current, thus causing the potential of the gate of the PMOS transistor 213 to become higher than the potential of the source of the PMOS transistor 213, the PMOS transistor 213 turns OFF.

What is illustrated in FIG. 12 is an exemplary waveform of the output signal to be output from the comparator 231 in the conversion circuit 230 in the case of a negative logic. If the potential of the signal line SL (i.e., the voltage level of an analog voltage signal which is input to the inverting input terminal) is higher than the reference voltage Vref, the comparator 231 outputs a digital signal at the Lo level. If the voltage level of an analog voltage signal which is input to the inverting input terminal is equal to or lower than the reference voltage Vref, the comparator 231 outputs a digital signal at the Hi level. In the case of a positive logic, if the voltage level of an analog voltage signal which is input to the inverting input terminal is higher than the reference voltage Vref, the comparator 231 outputs a digital signal at the Hi level. If the voltage level of an analog voltage signal which is input to the inverting input terminal is equal to or lower than the reference voltage Vref, the comparator 231 outputs a digital signal at the Lo level.

The reference voltage Vref is determined based on the voltage across both ends of the resistor 201 occurring because of a leakage current that may flow in the resistor 201 when the switch 100 is in an electrically non-conducting state. In the illustrated circuit models, the reference voltage Vref being input to the non-inverting input terminal of the comparator 231 is determined based on the voltage across both ends of the resistor 201. In the present preferred embodiment, the reference voltage Vref may be set to, e.g., about 12 V. As a result, even if the potential of the signal line SL increases due to a leakage current, the microcontroller 300 can be prevented from making an erroneous detection of the state of the switch 100. Moreover, the reference voltage Vref is generated based on the ratio of the two resistors 232 and 233, relative to the battery power supply (+B reference). This improves the robustness of the comparator 231 against power fluctuation.

As shown in FIG. 12, the state of the switch 100 transitions from an OFF state to an ON state, and then after 1 cycle, back to an OFF state. In synchronization, the voltage on the input terminal T1, i.e., the potential of the signal line SL, changes from the level of the supply voltage to the level of the bias voltage. In response to this change, the digital signal level which is output from the conversion circuit 230 changes from the Lo level to the Hi level.

FIG. 3 is referred to again. As described above, instead of the comparator 231, the conversion circuit 230 may include a bipolar transistor 234 as shown in FIG. 3. In this example, the threshold value corresponding to the reference voltage Vref is to be defined by a base-emitter voltage $V_{BE}$ of the bipolar transistor 234. The ratio of the two resistors 235 and 236 is to be set so that the input voltage Vin to the bipolar transistor 234 becomes appropriate. Specifically, based on the mathematical formula of Equation 1, the input voltage Vin can be adjusted as desired, relative to the base-emitter voltage $V_{BE}$, which serves as the threshold value. Herein, r1 is the resistance value of the resistor 235, and r2 is the resistance value of the resistor 236.

$$V_{BE}=Vin*r2/(r1+r2) \qquad \text{Equation 1:}$$

When the potential of the node between the two resistors 235 and 236 is equal to or lower than the voltage $V_{BE}$, the bipolar transistor 234 is in an OFF state, and a digital signal at the Hi level is output. When the potential of the node between the two resistors 235 and 236 becomes higher than the voltage $V_{BE}$, the bipolar transistor 234 turns ON so that a digital signal at the Lo level is output. Thus, instead of the comparator 231, the bipolar transistor 234 may be used in order to provide similar effects to those obtained by using the conversion circuit 230 as aforementioned.

By using the circuit models illustrated in FIG. 10 and FIG. 11, the inventor has studied the output signal that is output from the conversion circuit 230 when a leakage current exists because of water intrusion. It was confirmed that, even if a leakage current flows in the resistor 201, causing the potential of the signal line SL to increase owing to a voltage drop, setting an appropriate threshold value in the conversion circuit 230 allows a desired output signal as illustrated in FIG. 12 to be output from the conversion circuit 230.

As described earlier, for example, 30 to 40, or even more switches may be provided in the tractor. In the case of a large-sized tractor, a three-digit number of switches, e.g., 100 or more, may be provided in the tractor. Under conventional techniques, the more switches provided, the more heat will be generated in the input circuit. On the other hand, with the configuration of the input circuit 200 according to the present preferred embodiment, the transient current flowing instantaneously through each switch 100 mainly flows into the transient current circuit 210 so as to be consumed there. Moreover, the current flowing in the transient current circuit 210 is on the order of, e.g., several ten mA, which is about one digit smaller than in conventional examples. Therefore, power losses due to the transient current can be suppressed as compared to conventional examples. This provides a greater advantage as the number of switches 100 to be connected to the electronic control device 500 increases.

Reducing power losses in the input circuit 200 may mean reducing power losses in the entire electronic control device 500. This can make it possible to replace a metal housing with a resin sealing, which is lighter-weight than a metal housing and inexpensive. For example, by sealing the electronic control device with an epoxy resin or the like that has a relatively high heat-releasing ability, an electronic control device which excels in heat-releasing ability, dust proofness, and waterproofness can be provided. Moreover, by setting an appropriate reference voltage Vref in the conversion circuit 230, even if a leakage current occurs because of water intrusion, the microcontroller 300 can be prevented from making an erroneous detection of the state of the switch 100. Furthermore, this allows a multiplexer or like devices to operate asynchronously with the microcontroller 300 to be connected in between the input circuit 200 and the microcontroller 300. The more switches there are, the more ports will be needed by the microcontroller. From the standpoint of minimizing the number of ports, it would be very advantageous that some of the switches can be connected to the microcontroller via a multiplexer(s).

An example of the work vehicle according to the present preferred embodiment is a tractor, which is an agricultural machine. Hereinafter, an example configuration of a tractor will be described.

Figure 13:
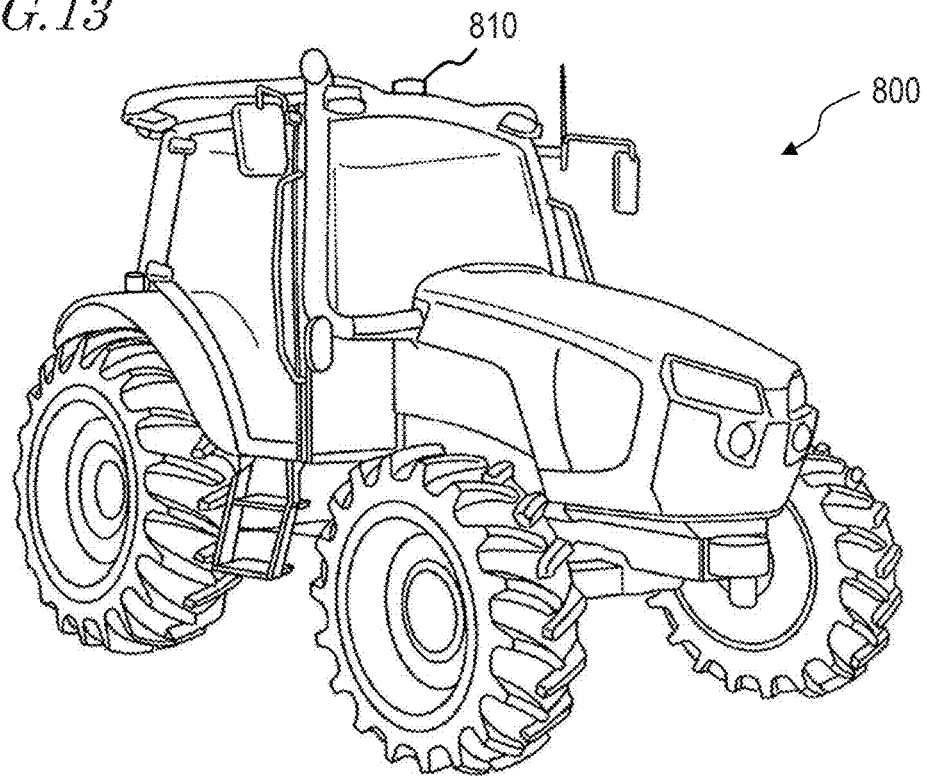
FIG. 13 is a perspective view showing an exemplary appearance of a tractor according to a preferred embodiment of the present invention.
Figure 14:
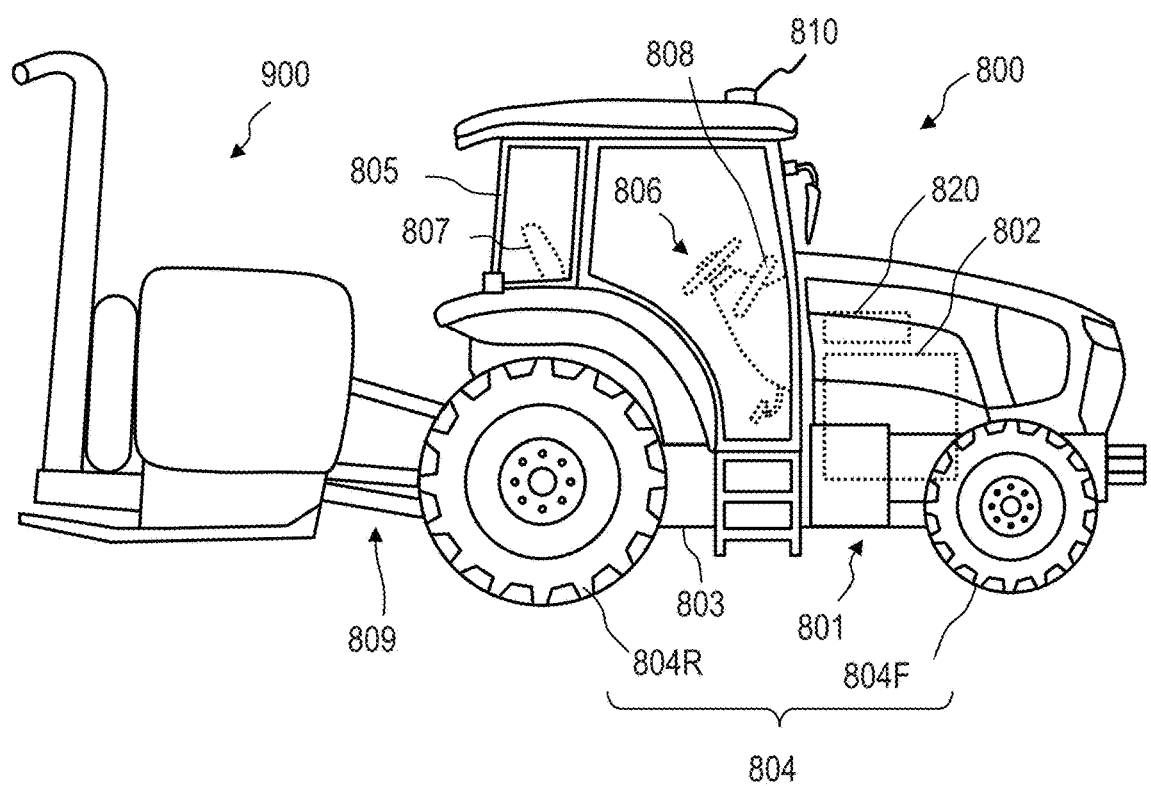
FIG. 14 is a schematic diagram showing a tractor and an implement linked to the tractor as viewed in a lateral direction, according to a preferred embodiment of the present invention.
Figure 15:
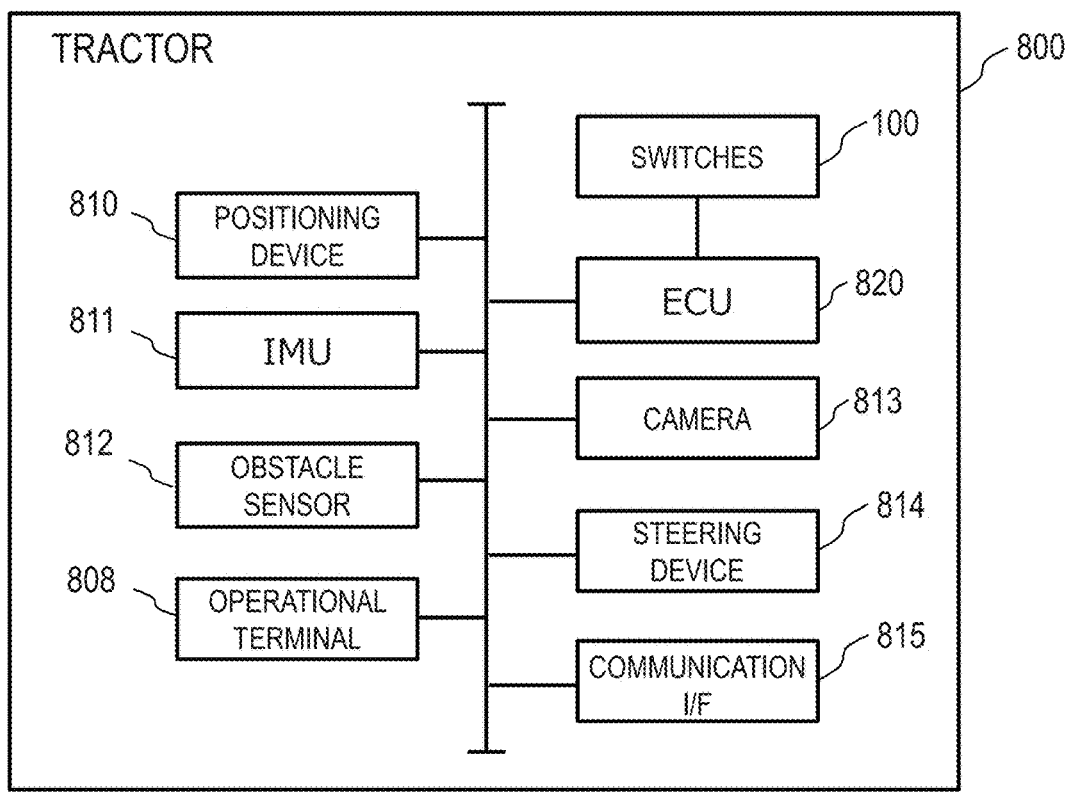
FIG. 15 is a block diagram showing an example configuration of a schematic configuration of a tractor according to a preferred embodiment of the present invention.
Figure 16:
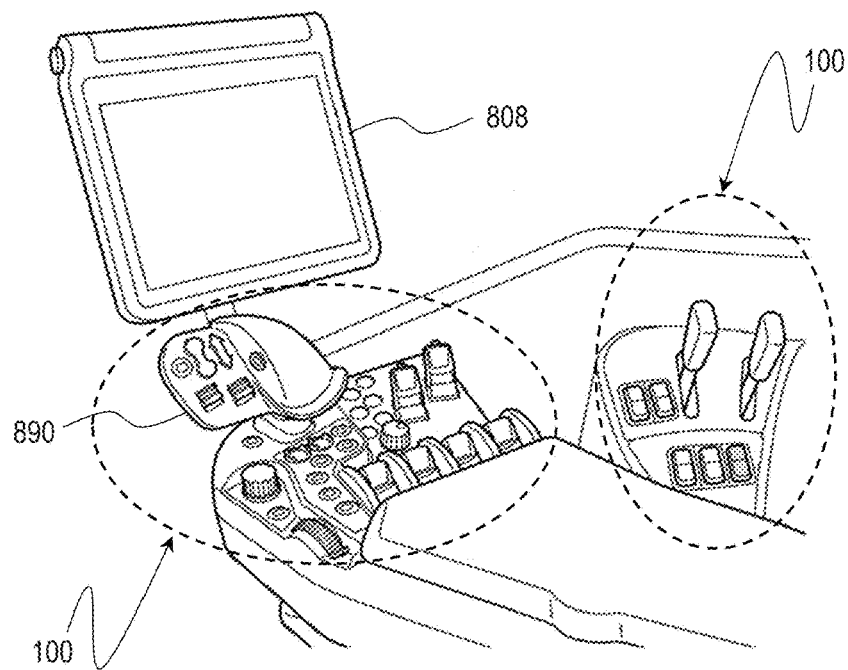
FIG. 16 is a schematic diagram illustrating exemplary operation switches provided in a cabin.

FIG. 13 is a perspective view showing an exemplary appearance of a tractor 800 according to the present preferred embodiment. FIG. 14 is a schematic diagram showing the tractor 800 and an implement 900 linked to the tractor 800 as viewed in a lateral direction. FIG. 15 is a block diagram showing an example configuration of a schematic configuration of the tractor 800. FIG. 16 is a schematic diagram illustrating exemplary operation switches 100 provided in a cabin 805.

In the illustrated example, the tractor 800 includes a vehicle body 801, a prime mover (engine) 802, and a transmission 803, a positioning device 810, and one or more ECUs 820. On the vehicle body 801, tires 804 (wheels) and a cabin 805 are provided. The tires 804 include a pair of front wheels 804F and a pair of rear wheels 804R. Inside the cabin 805, a steering wheel 806, a driver's seat 807, and an operational terminal 808 are provided. Either pair of the front wheels 804F or the rear wheels 804R may be crawlers, rather than tires.

The prime mover 802 may be a diesel engine, for example. Instead of a diesel engine, an electric motor may be used. The transmission 803 can change the propulsion and velocity of the tractor 800 through a speed changing mechanism. The transmission 803 can also switch between forward travel and backward travel of the tractor 800.

The positioning device 810 may be a GNSS unit, for example. The positioning device 810 is a GNSS receiver that includes an antenna to receive signals from a GNSS satellite and a processing circuit. The positioning device 810 receives GNSS signals which are transmitted from a GNSS satellite, such as the GPS (Global Positioning System), Galileo, or QZSS (Quasi-Zenith Satellite System, e.g., MICHIBIKI), and performs positioning based on the signals. Although the positioning device 810 in the present preferred embodiment is disposed above the cabin 805, it may be disposed at any other position. Through positioning by the positioning device 810, geographic information of the tractor 800 based on the geographic coordinate system is obtained.

The positioning device 810 may perform interferometric positioning such as RTK (Real Time Kinematic GPS). In the case where RTK positioning is performed, the positioning device 810 includes an RTK receiver. The positioning device 810 receives GNSS signals that are transmitted from GNSS satellites and correction signals that are transmitted from reference stations, and performs positioning based on these signals. Interferometric positioning such as RTK positioning allows positioning with a precision that admits errors within several centimeters. Positional information, including latitude, longitude, and altitude information, is generated through high-precision positioning.

The tractor 800 may include one or more ECUs 820. The one or more ECUs 820 may include, for example: an ECU(s) configured or programmed to control the travel of the tractor 800; and an ECU(s) configured or programmed to control automatic steering based on geographic information that is acquired by the positioning device 810. At least one of such ECUs 820 is electrically connected to an operation switch 100 that is provided in the cabin 805, and is configured or programmed to detect whether the operation switch 100 is in an electrically conducting state or an electrically non-conducting state and perform at least one process in accordance with the detected result.

The at least one process to be performed by the one or more ECUs 820 may include a process to control the operation of an actuator that is provided in the work vehicle, and/or a process to perform self-driving or automatic steering, for example. Examples of actuators include a prime mover, a transmission, a hydraulic device, and an electric motor. As has already been described, examples of switches to be disposed in the cabin 805 include a switch to select the gear shift as to a main gear shift or a range gear shift, a switch to switch between forward travel and backward travel, and a switch to raise or lower the implement 900. As an example, the ECU 820 can perform a process of controlling the operation of the transmission 803, in response to a user's manipulation of switching the gear shift, or a user's manipulation of switching between forward travel and backward travel. As another example, the ECU 820 can perform a process of controlling the operation of a hydraulic device that is provided in a linkage device 809 (described below), in response to a user's manipulation of switching raising or lowering the implement 900.

Examples of switches to be disposed in the cabin 805 may include a switch to switch between the auto mode and the manual mode as to steering. For example, in response to a user's choice of the auto mode, the ECU 820 may begin acquiring positional information that is output from the positioning device 810 and any information needed for automatic steering, including attitude information that is output from an inertial measurement unit (IMU) 811 (described below).

As the ECU 820, any of the electronic control devices 500, 500A, 500B and 500C according to the present preferred embodiment may be used. In a harsh environment, this can suitably protect the electronic control device from adhesion of mud, adhesion of powder dust, or exposure to the wind and rain. Moreover, by mounting the electronic control devices 500, 500A, 500B and 500C according to the present preferred embodiment on a large-sized tractor, in which, e.g., over 100 switches 100 may be provided, it is possible to prevent or reduce the problem of heat generation, which was difficult to solve by conventional techniques. Instead of using a metal housing, the electronic control device may be sealed with an epoxy resin or the like, for example, whereby an electronic control device which excels in heat-releasing ability, dust proofness, and waterproofness can be realized. Such an electronic control device is advantageous for work vehicles (e.g., tractors) for use in harsh environments.

A steering device 814 includes a steering wheel 806, a steering shaft connected to the steering wheel 806, and a power steering device to assist in the steering by the steering wheel. The front wheels 804F are the wheels responsible for steering, such that changing their steering angle can cause a change in the traveling direction of the tractor 800. The steering angle of the front wheels 804F can be changed by manipulating the steering wheel. The power steering device includes a hydraulic device or an electric motor to supply an assisting force for changing the steering angle of the front wheels 804F. When self-driving or automatic steering is performed, under the control of the ECU disposed in the tractor 800, the steering angle may be automatically adjusted by the power of the hydraulic device or electric motor.

A linkage device 809 is provided at the rear of the vehicle body 801. The linkage device 809 may include e.g. a three-point linkage (also referred to as a "three-point link" or a "three-point hitch"), a PTO (Power Take Off) shaft, and a universal joint. The linkage device 809 allows the implement 900 to be attached to or detached from the tractor 800. The linkage device 809 is able to raise or lower the three-point link with a hydraulic device, for example, thus controlling the position or attitude of the implement 900. Moreover, motive power can be transmitted from the tractor 800 to the implement 900 via the universal joint. The linkage device may be provided frontward of the vehicle body 801. In that case, the implement may be connected frontward of the tractor 800.

In the case where the implement 900 is mounted on a three-point hitch, the three-point hitch can be raised or lowered by e.g., a hydraulic device, thus controlling the position or attitude of the implement 900. The implement 900 can move as it is towed by the tractor 800, and perform predetermined tasks.

The operational terminal 808 is a terminal for the user to perform a manipulation related to the self-driving or automatic steering of the tractor 800 and may be referred to as a virtual terminal (VT). Self-driving is distinct from automatic steering in that not only automatic steering but also velocity control may be performed, for example. The operational terminal 808 may include a display device such as a touch screen panel, and/or one or more buttons. By manipulating the terminal 808, the user can perform various manipulations, such as switching ON/OFF the self-driving mode or the automatic steering mode, setting an initial position of the tractor 800, and setting a path.

Under the control of the ECU(s), the tractor 800 is able to travel via self-driving or automatic steering based on the geographic information acquired by the positioning device 810. When self-driving or automatic steering is performed, the steering angle may be automatically adjusted by the steering device 814 being controlled by the ECU 820.

The tractor 800 may include an IMU 811, and also one or more obstacle sensors 812 and one or more cameras 813. The positioning device 810 and the IMU 811 may be integrated into one unit to be mounted on the tractor 800.

The IMU 811 includes a 3-axis accelerometer and a 3-axis gyroscope. The IMU 811 defines and functions as a motion sensor which can output signals representing parameters such as acceleration, velocity, displacement, and attitude of the tractor 800. The obstacle sensor(s) 812 detects objects that are relatively close to the tractor 800. Each obstacle sensor 812 may include a laser scanner or an ultrasonic sonar, for example. For example, a plurality of laser scanners and a plurality of ultrasonic sonars may be provided at different positions on the vehicle body. A plurality of cameras 813 may be provided at different positions of the vehicle body. For example, one or more ECUs may cooperate to realize sophisticated engine control, transmission control, power steering control, and braking control that are required for self-driving or automatic steering, by utilizing the geographic information acquired by the positioning device 810 as well as output signals from the IMU 811, output data from the obstacle sensor(s) 812, and image data acquired by the one or more cameras 813.

The tractor 800 may further include a communication I/F 815. The communication I/F 815 may be a communication module to communicate with a user terminal device such as a lap-top PC or a tablet computer, for example. The communication I/F 815 can perform wireless communications under the Bluetooth (registered trademark) standards and/or Wi-Fi (registered trademark) standards, for example. The communication I/F 815 may be a communication module capable of performing wireless communications in accordance with the BLE (Bluetooth Low Energy) or LPWA (Low Power Wide Area) communication methods. The communication I/F 815 may perform wireless communications by using a cellular network or a network that involves artificial satellites.

In the example shown in FIG. 15, the positioning device 810, the IMU 811, the obstacle sensor(s) 812, the camera(s) 813, the steering device 814, the communication I/F 815, the operational terminal 808, and the ECU(s) 820 can communicate with one another under a vehicle bus standard such as CAN.

One or more switches 100 that are manipulable by the user may be disposed in the cabin 805. In the example shown in FIG. 16, a plurality of switches 100 are disposed in the cabin 805. Examples of the plurality of switches 100 may include a switch to select the gear shift as to a main gear shift or a range gear shift, a switch to switch between the auto mode and the manual mode, a switch to switch between forward travel and backward travel, a switch to raise or lower the implement 900, and a switch to switch ON/OFF the function of traveling while maintaining a constant velocity. For example, a switch to switch between forward travel and backward travel, a switch to raise or lower the implement 900, and the like may be disposed in a centralized location on an arm rest 890 including a gearshift lever.

Although the implement 900 shown in FIG. 14 is a sprayer that sprays a chemical agent over crops, the implement 900 is not limited to a sprayer. For example, any arbitrary implement such as a mower, a seeder, a spreader, a rake, a baler, a harvester, a plow, a harrow, or a rotary tiller may be connected to the tractor 800 for use.

Thus, the present disclosure encompasses electronic control devices, input circuits, and work vehicles as recited in the following Items.

Item 1

An electronic control device to be mounted in a work vehicle, the work vehicle including a switch that includes a first terminal and a second terminal to switch between an electrically conducting state and an electrically non-conducting state between the first terminal and the second terminal, the electronic control device including an input terminal that is connected to the second terminal of the switch via an electrically conductive lead, an input circuit that is connected to the input terminal via a signal line, and a microcontroller to detect whether the switch is in the electrically conducting state or the electrically non-conducting state based on an output signal from the input circuit, and to perform at least one process in accordance with a detected result, wherein the input circuit includes a first resistor connected to a supply voltage or ground and to the signal line, and a transient current circuit connected to the supply voltage or ground and to the signal line, the transient current circuit including a second resistor to allow a transient current to flow through the switch when the switch transitions from the electrically non-conducting state to the electrically conducting state.

Item 2

The electronic control device of Item 1, wherein the input circuit further includes a conversion circuit to convert, based on a reference voltage, an analog voltage signal on an output end of the signal line into a digital signal at a logical high level or low level, and to output the digital signal as the output signal.

Item 3

The electronic control device of Item 2, wherein the first resistor has a resistance value which is greater than a resistance value of the second resistor.

Item 4

The electronic control device of Item 3, wherein a ratio of the resistance value of the first resistor to the resistance value of the second resistor is equal to or greater than about 3.0 but less than about 5.0.

Item 5

The electronic control device of any of Items 2 to 4, wherein the reference voltage is determined based on a voltage across both ends of the first resistor that occurs because of a leakage current flowing in the first resistor when the switch is in the electrically non-conducting state.

Item 6

The electronic control device of any of Items 1 to 5, wherein the transient current circuit includes an RC series circuit that includes the second resistor.

Item 7

The electronic control device of any of Items 1 to 5, wherein the transient current circuit further includes a PMOS transistor including a drain connected to the ground, and the second resistor is connected to the signal line and a source of the PMOS transistor.

Item 8

The electronic control device of any of Items 1 to 7, wherein the input circuit further includes a low-pass filter circuit.

Item 9

The electronic control device of any of Items 1 to 5, wherein the input circuit further includes an RC low-pass filter circuit that includes a capacitor including a first end connected to the ground and a second end connected to the signal line, the transient current circuit further includes a PMOS transistor including a drain connected to the ground, the second resistor is connected to the signal line and a source of the PMOS transistor, and the second end of the capacitor is connected to a gate of the PMOS transistor.

Item 10

The electronic control device of any of Items 2 to 5, wherein the conversion circuit includes a comparator to compare the analog voltage signal and the reference voltage in terms of magnitude, and to output the digital signal in accordance with a result of comparison.

Item 11

The electronic control device of any of Items 2 to 5, wherein the conversion circuit includes a voltage divider including two resistors in series connection between the output end of the signal line and the ground, and a bipolar transistor including an emitter connected to the ground and a base connected to a node between the two resistors, and the output signal changes in accordance with a collector voltage of the bipolar transistor.

Item 12

The electronic control device of any of Items 1 to 11, wherein the input circuit includes a plurality of input circuits and the input terminal includes a plurality of input terminals, the plurality of input terminals are connected to a plurality of switches, respectively, via a plurality of electrically conductive leads, and the plurality of input circuits are connected to the plurality of input terminals, respectively, via a plurality of signal lines.

Item 13

The electronic control device of Item 12, further including a multiplexer connected to the plurality of input circuits and to the microcontroller to output a selected one of the output signals from the plurality of input circuits, wherein based on the output signal from the multiplexer, the microcontroller is configured or programmed to detect whether one of the plurality of switches is in the electrically conducting state or the electrically non-conducting state.

Item 14

The electronic control device of any of Items 1 to 13, wherein, the first terminal of the switch is connected to the supply voltage, the first resistor is a pull-down resistor connected to the signal line and the ground, and the transient current circuit is connected to the ground and the signal line.

Item 15

A work vehicle including one or more switches manipulable by a user, and the electronic control device of any of Items 1 to 14.

Item 16

An input circuit to be connected via a signal line to an input terminal of an electronic control device to be mounted in a work vehicle, the work vehicle including a switch that includes a first terminal and a second terminal to switch between an electrically conducting state and an electrically non-conducting state between the first terminal and the second terminal, wherein the input terminal is connected to the second terminal of the switch via an electrically conductive lead, the electronic control device includes a microcontroller to detect whether the switch is in the electrically conducting state or the electrically non-conducting state based on an output signal from the input circuit, and to perform at least one process in accordance with a detected result and the input circuit includes a first resistor connected to a supply voltage or ground and to the signal line, and a transient current circuit connected to the supply voltage or ground and to the signal line, the transient current circuit including a second resistor to allow a transient current to flow through the switch when the switch transitions from the electrically non-conducting state to the electrically conducting state.

Preferred embodiments of the present disclosure are applicable to work vehicles, such as agricultural machines or construction machines, which require an electronic control device.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic control device to be mounted in a work vehicle, the work vehicle including a switch that includes a first terminal and a second terminal to switch between an electrically conducting state and an electrically non-conducting state between the first terminal and the second terminal, the electronic control device comprising:
   an input terminal connected to the second terminal of the switch via an electrically conductive lead;
   an input circuit connected to the input terminal via a signal line; and
   a microcontroller to detect whether the switch is in the electrically conducting state or the electrically non-conducting state based on an output signal from the input circuit, and to perform at least one process in accordance with a detected result; wherein
   the input circuit includes:
      a first resistor connected to a supply voltage or ground and to the signal line;
      a transient current circuit connected to the supply voltage or ground and to the signal line, the transient current circuit including a second resistor to allow a transient current to flow through the switch when the switch transitions from the electrically non-conducting state to the electrically conducting state; and
      a conversion circuit to convert, based on a reference voltage, an analog voltage signal on an output end of the signal line into a digital signal at a logical high level or low level, and to output the digital signal as the output signal; and
   the reference voltage is determined based on a voltage across both ends of the first resistor that occurs because of a leakage current flowing in the first resistor when the switch is in the electrically non-conducting state.

2. The electronic control device of claim 1, wherein the first resistor has a resistance value which is greater than a resistance value of the second resistor.

3. The electronic control device of claim 2, wherein a ratio of the resistance value of the first resistor to the resistance value of the second resistor is equal to or greater than about 3.0 but less than about 5.0.

4. The electronic control device of claim 1, wherein the transient current circuit includes an RC series circuit that includes the second resistor.

5. The electronic control device of claim 1, wherein
   the transient current circuit further includes a PMOS transistor including a drain connected to the ground; and
   the second resistor is connected to the signal line and a source of the PMOS transistor.

6. The electronic control device of claim 1, wherein the input circuit further includes a low-pass filter circuit.

7. An electronic control device to be mounted in a work vehicle, the work vehicle including a switch that includes a first terminal and a second terminal to switch between an electrically conducting state and an electrically non-conducting state between the first terminal and the second terminal, the electronic control device comprising:
   an input terminal connected to the second terminal of the switch via an electrically conductive lead;
   an input circuit connected to the input terminal via a signal line; and
   a microcontroller to detect whether the switch is in the electrically conducting state or the electrically non-conducting state based on an output signal from the input circuit, and to perform at least one process in accordance with a detected result; wherein
   the input circuit includes:
      a first resistor connected to a supply voltage or ground and to the signal line;

a transient current circuit connected to the supply voltage or ground and to the signal line, the transient current circuit including a second resistor to allow a transient current to flow through the switch when the switch transitions from the electrically non-conducting state to the electrically conducting state; and an RC low-pass filter circuit that includes a capacitor including a first end connected to the ground and a second end connected to the signal line;

the transient current circuit further includes a PMOS transistor including a drain connected to the ground;

the second resistor is connected to the signal line and a source of the PMOS transistor; and the second end of the capacitor is connected to a gate of the PMOS transistor.

8. The electronic control device of claim 1, wherein the conversion circuit includes a comparator to compare the analog voltage signal and the reference voltage in terms of magnitude, and to output the digital signal in accordance with a result of comparison.

9. The electronic control device of claim 1, wherein the conversion circuit includes:

a voltage divider including two resistors in series connection between the output end of the signal line and the ground; and a bipolar transistor including an emitter connected to the ground and a base connected to a node between the two resistors; and the output signal changes in accordance with a collector voltage of the bipolar transistor.

10. The electronic control device of claim 1, wherein the input circuit includes a plurality of input circuits and the input terminal includes a plurality of input terminals;

the plurality of input terminals are connected to a plurality of switches, respectively, via a plurality of electrically conductive leads; and the plurality of input circuits are connected to the plurality of input terminals, respectively, via a plurality of signal lines.

11. The electronic control device of claim 10, further comprising a multiplexer connected to the plurality of input circuits and to the microcontroller to output a selected one of the output signals from the plurality of input circuits; wherein based on the output signal from the multiplexer, the microcontroller is configured or programmed to detect whether one of the plurality of switches is in the electrically conducting state or the electrically non-conducting state.

12. The electronic control device of claim 1, wherein, the first terminal of the switch is connected to the supply voltage;

the first resistor is a pull-down resistor connected to the signal line and the ground; and the transient current circuit is connected to the ground and the signal line.

13. A work vehicle comprising:

one or more switches manipulable by a user; and the electronic control device of claim 1.

14. An input circuit to be connected via a signal line to an input terminal of an electronic control device to be mounted in a work vehicle, the work vehicle including a switch that includes a first terminal and a second terminal to switch between an electrically conducting state and an electrically non-conducting state between the first terminal and the second terminal; wherein the input terminal is connected to the second terminal of the switch via an electrically conductive lead;

the electronic control device includes a microcontroller to detect whether the switch is in the electrically conducting state or the electrically non-conducting state based on an output signal from the input circuit, and to perform at least one process in accordance with a detected result; and the input circuit includes:

a first resistor connected to a supply voltage or ground and to the signal line;

a transient current circuit connected to the supply voltage or ground and to the signal line, the transient current circuit including a second resistor to allow a transient current to flow through the switch when the switch transitions from the electrically non-conducting state to the electrically conducting state; and a conversion circuit to convert, based on a reference voltage, an analog voltage signal on an output end of the signal line into a digital signal at a logical high level or low level, and to output the digital signal as the output signal; and the reference voltage is determined based on a voltage across both ends of the first resistor that occurs because of a leakage current flowing in the first resistor when the switch is in the electrically non-conducting state.

15. The electronic control device of claim 1, wherein the first resistor is a pull-down resistor and the first terminal is connected to the supply voltage.

16. The electronic control device of claim 1, wherein the first resistor is a pull-up resistor and the first terminal is connected to the ground.

* * * * *